(12) United States Patent
Nomiya et al.

(10) Patent No.: US 8,168,288 B2
(45) Date of Patent: May 1, 2012

(54) MULTILAYER CERAMIC SUBSTRATE AND METHOD FOR MANUFACTURING THE SAME

(75) Inventors: Masato Nomiya, Moriyama (JP); Satoshi Asakura, Echizen (JP); Tatsuya Ueda, Okayama (JP); Akira Baba, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 462 days.

(21) Appl. No.: 12/548,661

(22) Filed: Aug. 27, 2009

(65) Prior Publication Data

US 2010/0006335 A1 Jan. 14, 2010

Related U.S. Application Data

(63) Continuation of application No. PCT/JP2008/064518, filed on Aug. 13, 2008.

(30) Foreign Application Priority Data

Oct. 17, 2007 (JP) .................................. 2007-269636

(51) Int. Cl.
*H05K 1/11* (2006.01)
*B32B 17/06* (2006.01)
*B22F 3/10* (2006.01)
*C04B 35/64* (2006.01)

(52) U.S. Cl. ........ 428/209; 428/210; 428/432; 428/552; 174/250; 174/251; 174/252; 174/253; 174/262; 156/89.16; 501/32

(58) Field of Classification Search .................. 172/262, 172/250–258; 428/432, 552, 209, 210; 156/89.16
See application file for complete search history.

(56) References Cited

U.S. PATENT DOCUMENTS

| | | | | |
|---|---|---|---|---|
| 5,627,344 A | * | 5/1997 | Tanifuji et al. | 174/257 |
| 5,729,893 A | * | 3/1998 | Tanifuji et al. | 29/830 |
| 5,847,326 A | * | 12/1998 | Kawakami et al. | 174/256 |
| 2002/0058131 A1 | * | 5/2002 | Nishide et al. | 428/210 |
| 2002/0155264 A1 | * | 10/2002 | Nishide et al. | 428/210 |

FOREIGN PATENT DOCUMENTS

| | | |
|---|---|---|
| JP | 2001-160683 A | 6/2001 |
| JP | 2001-291959 A | 10/2001 |
| JP | 2001-326301 A | 11/2001 |
| JP | 2002-50865 A | 2/2002 |
| JP | 2005-93846 A | 4/2005 |

OTHER PUBLICATIONS

Official Communication issued in International Patent Application No. PCT/JP2008/064518, mailed on Nov. 4, 2008.

* cited by examiner

*Primary Examiner* — David Sample
*Assistant Examiner* — Tahseen N Khan
(74) *Attorney, Agent, or Firm* — Keating & Bennett, LLP

(57) ABSTRACT

In a multilayer ceramic substrate manufactured by a non-shrinking process, a bonding strength of an external conductive film formed on a primary surface of the multilayer ceramic substrate is increased. After a laminate of a multilayer ceramic substrate is formed from first ceramic layers and second shrinkage suppressing ceramic layers, and an underlayer is formed along one primary surface of the multilayer ceramic substrate, an external conductive film is formed on the underlayer. A non-sintering ceramic material powder in a non-sintered state is included in both the external conductive film and the underlayer, and this non-sintering ceramic material powder is fixed due to diffusion of a glass component from the first ceramic layers.

13 Claims, 3 Drawing Sheets

MULTILAYER CERAMIC SUBSTRATE AND METHOD FOR MANUFACTURING THE SAME

BACKGROUND OF THE INVENTION

1. Field of the Invention

The present invention relates to a multilayer ceramic substrate and a method for manufacturing the same, and more particularly, to a multilayer ceramic substrate that is provided with external conductive films on surfaces thereof and that is manufactured by a non-shrinking process and to a method for manufacturing the multilayer ceramic substrate.

2. Description of the Related Art

A technique of interest to the present invention has been disclosed, for example, in Japanese Unexamined Patent Application Publication No. 2001-291959. Japanese Unexamined Patent Application Publication No. 2001-291959 discloses a method for manufacturing a multilayer ceramic substrate by firing a laminate including base green sheets including a low temperature sintering ceramic material and shrinkage suppressing inorganic material layers including a shrinkage suppressing inorganic material laminated thereto, which attempts to solve the following problem. The problem is that at the stage at which a shrinkage suppressing effect of the shrinkage suppressing inorganic material layers does not act on the base green sheets during a firing step, a conductive paste body defining wire conductors provided on a green laminate starts to shrink, and as a result, in an obtained multilayer ceramic substrate, cracks, bumps, and gaps may be generated. In Japanese Unexamined Patent Application Publication No. 2001-291959, in order to solve the problem, the conductive paste body is formed using a copper-based conductive paste including $Cu_2O$, and an oxygen partial pressure in a firing atmosphere is controlled during a firing step so as to make the shrinkage behavior generated when $Cu_2O$ is reduced to Cu similar to that of the low temperature sintering ceramic material included in the base green sheets.

However, the technique disclosed in Japanese Unexamined Patent Application Publication No. 2001-291959 produces the following problem that must also be solved. As the wire conductors in the multilayer ceramic substrate, there are external conductive films, internal conductive films, and via hole conductors. When conductive paste films defining the external conductive films are fired simultaneously with the green laminate, the green laminate does not substantially shrink in a primary surface direction but shrinks only in a lamination direction, and the conductive paste films shrink in isotropic directions including the primary surface direction. Thus, a tensile stress caused by the shrinkage of the conductive paste films is applied to the laminate at peripheral portions of the conductive paste films, and as a result, cracks may be generated in the multilayer ceramic substrate and/or the strength thereof may be degraded.

The problems described above are particularly likely to occur when the shrinkage suppressing inorganic material layer is arranged along the external surface of the green laminate. However, when the strength of the laminate itself is taken into account, the shrinkage suppressing inorganic material layer is effectively arranged along the external surface of the laminate. The reason for this is that when the shrinkage suppressing inorganic material layer is arranged along the external surface of the laminate, a state is obtained in which a compressive stress is applied to the external surface of the laminate after firing is performed. Due to this compressive stress, it has been difficult to depart from a configuration in which the shrinkage suppressing inorganic material layer is arranged along the external surface of the laminate.

In addition, in order to form the conductive paste film, the use of a copper-based conductive paste including $Cu_2O$ reduces the generation of cracks and a decrease in strength to a certain extent. However, these effects may not be sufficient. In addition, the conductive paste disclosed in Japanese Unexamined Patent Application Publication No. 2001-291959 includes a glass component. Where the external conductive film is formed using the conductive paste as described above, when the shrinkage suppressing inorganic material layer or the base green sheet located under the external conductive film includes glass, or when a glass component is deposited on the external surface from the inside of the laminate during a firing step, a flat glass-rich layer having poor bonding properties is formed at a bottom surface side of the external conductive film after the firing is performed, and as a result, the bonding strength of the external conductive film may be insufficient.

SUMMARY OF THE INVENTION

To overcome the problems described above, preferred embodiments of the present invention provide a multilayer ceramic substrate in which the generation of cracks and decreased strength are prevented from occurring and a method for manufacturing the multilayer ceramic substrate.

A multilayer ceramic substrate according to a preferred embodiment of the present invention includes a laminate having a plurality of first ceramic layers including a sintering ceramic material that includes a glass component or that is capable of generating a glass component and each being in a sintered state, and at least one second ceramic layer that is arranged between the first ceramic layers and that includes a first non-sintering ceramic material powder that is not substantially sintered at a temperature at which the sintering ceramic material is sintered, in which the first non-sintering ceramic material powder is in a fixed state due to diffusion of a portion of the glass component from the first ceramic layers into the second ceramic layer.

The laminate preferably further includes at least one underlayer that is arranged along at least one primary surface thereof facing the outside of the laminate and that includes a second non-sintering ceramic material powder that is not substantially sintered at a temperature at which the sintering ceramic material is sintered, in which the second non-sintering ceramic material powder is in a fixed state due to diffusion of a portion of the glass component from the first ceramic layers into the underlayer.

On the underlayer, at least one external conductive film is preferably provided that includes conductive metal particles and a third non-sintering ceramic material powder that is not substantially sintered at a temperature at which the sintering ceramic material is sintered, in which the conductive metal particles and the third sintering ceramic material are in a fixed state due to a portion of the glass component being diffused from the first ceramic layers into the external conductive film.

In addition, when an area ratio on a cross-sectional surface parallel or substantially parallel to the primary surface of the laminate is observed, an area ratio of the conductive metal particles included in the external conductive film preferably has a gradient increasing from an underlayer side to a surface side of the external conductive film, and an area ratio of the third non-sintering ceramic material powder included in the external conductive film preferably has a gradient increasing from the surface side of the external conductive film to the underlayer side.

The first, second, and third non-sintering ceramic material powders described above are preferably made of the same type of ceramic material, for example.

In the multilayer ceramic substrate according to a preferred embodiment of the present invention, although the underlayer may be configured to have at least one island shape only in a region in which the external conductive film is provided, the underlayer is preferably disposed over substantially the entire primary surface of the laminate.

The multilayer ceramic substrate according to a preferred embodiment of the present invention may preferably further include at least one via hole conductor connected to the external conductive film and arranged to penetrate at least the underlayer and a specific first ceramic layer in the thickness direction. In the case described above, the via hole conductor preferably includes conductive metal particles and a fourth non-sintering ceramic material powder that is not substantially sintered at a temperature at which the sintering ceramic material is sintered and more preferably further includes a glass component, for example.

The first, second, third, and fourth non-sintering material powders described above are preferably made of the same type of ceramic material, for example.

The conductive metal particles preferably include at least one of Cu, Ag, Ni, and Pd, for example.

The non-sintering ceramic material powders preferably include an oxide including at least one of Al, Zr, Ti, Si, Nb, and Ta, for example.

The sintering ceramic material is preferably a Ba—Al—Si-based oxide ceramic material, for example, and includes a boron-based oxide, for example, as an additive.

A metal plating film may be further arranged so as to cover the external conductive film.

A method for manufacturing the multilayer ceramic substrate according to a preferred embodiment of the present invention includes the steps of preparing a green laminate to be formed into the laminate, the green laminate being formed of first ceramic green layers including the sintering ceramic material to be formed into the first ceramic layers, at least one second ceramic green layer including the first non-sintering ceramic material powder to be formed into the second ceramic layer, and at least one underlying green layer including the second non-sintering ceramic material powder to be formed in the underlayer, and the green laminate being provided with at least one conductive green film including the conductive metal particles and the third non-sintering ceramic material powder to be formed into the external conductive film, and firing the green laminate provided with the conductive green film at a temperature at which the sintering ceramic material is sintered, the first, second, and third non-sintering ceramic material powders are not substantially sintered, and the conductive metal particles are not melted to obtain the first ceramic layers in a sintered state and to allow a portion of the glass component from the first ceramic layers to diffuse into the second ceramic green layer, the underling green layer, and the conductive green film, so that the second ceramic layer and the underlayer are obtained in which the first and the second non-sintering ceramic material powders are in a fixed state, respectively, and so that the external conductive film is obtained in which the conductive metal particles and the third non-sintering ceramic material powder are in a fixed state.

In the method for manufacturing the multilayer ceramic substrate according to a preferred embodiment of the present invention, at least some of the conductive metal particles included in the conductive green film are preferably in the state in which the third non-sintering ceramic material powder is adhered to the surfaces thereof.

In addition, before the step of firing the green laminate, the conductive green film preferably includes no glass component.

According to a preferred embodiment of the present invention, a layer that includes the glass component and a relatively large amount of the third non-sintering ceramic material powder is formed at an underlayer side of the external conductive film, and this layer functions as a bonding buffer layer to the underlayer that includes the glass component and the second non-sintering ceramic material powder. Thus, the shrinkage of the external conductive film in a primary surface direction during a firing step can be minimized and prevented, and a tensile stress generated in a peripheral portion of the external conductive film to the laminate is not likely to be directly applied thereto, so that problems of the generation of cracks and decreased strength are unlikely to occur. In this case, since the composition is preferably changed in a gradient manner from the external conductive film to the underlayer, a portion of the external conductive film to which a high stress is applied is not formed at the underlayer side.

In addition, since the glass component deeply diffuses into the external conductive film while incorporating the third non-sintering ceramic material powder, the strength in a region in which the glass component is distributed is improved by the third non-sintering ceramic material powder, and in addition, since an anchor structure having superior bonding properties is formed, a bonding strength of the external conductive film can be increased.

In the multilayer ceramic substrate according to a preferred embodiment of the present invention, when the second non-sintering ceramic material powder included in the underlay and the third non-sintering ceramic material powder included in the external conductive film are made of the same type of ceramic material, an effect of increasing the bonding strength of the external conductive film can be more reliably obtained. In addition, when the first non-sintering ceramic material powder included in the second ceramic layer is also made of the same type of ceramic material, since the difference in behavior among the first ceramic layer, the second ceramic layer, and the underlayer during a firing step and unwanted side reactions among the ceramic materials are not necessarily taken into consideration, the design and the control of the process of the multilayer ceramic substrate can be simplified.

In the multilayer ceramic substrate according to a preferred embodiment of the present invention, when the underlayer is disposed over substantially the entire primary surface of the laminate, this underlayer may have a function similar to that of the second ceramic layer. Thus, during a firing step, the shrinkage of the laminate can be further suppressed, and after the firing, the laminate can be placed in a state in which a compressive stress is applied to substantially the entire surface, so that the strength of the multilayer ceramic substrate can be increased.

In the multilayer ceramic substrate according to a preferred embodiment of the present invention, when the via hole conductor is connected to the external conductive film and is arranged to penetrate at least the underlayer and a specific first ceramic layer in the thickness direction, and when this via hole conductor includes conductive metal particles and the fourth non-sintering ceramic material powder, the shrinkage of the via hole conductor during a firing step can be prevented and minimized, and the generation of stress caused by this shrinkage can be prevented. In addition, bonding strengths of the via hole conductor to the external conductive film and the underlayer can be increased. In addition, since the via hole conductor is arranged to penetrate the underlayer and to be connected to the external conductive film, during a firing step, in particular, during the first half thereof, a shrinking force in a diameter direction of the via hole conductor can be reduced by the external conductive film.

When the first, second, third, and fourth non-sintering ceramic material powders are made of the same type of ceramic materials, since the difference in behavior among the individual portions during a firing step and unwanted side reactions among the ceramic materials are not necessarily taken into consideration, the design and control of the process of the multilayer ceramic substrate can be simplified.

When the above via hole conductor further includes a glass component, a bonding buffer layer can be provided on the via hole conductor as in the case of the external conductive film, and as a result, a bonding strength between the via hole conductor and the surrounding first ceramic layer can be increased.

According to a method for manufacturing the multilayer ceramic substrate according to a preferred embodiment of the present invention, during the firing step, a portion of the glass component included in the first ceramic green layers is allowed to diffuse into the conductive green film through the underlying green layer so as to obtain the external conductive film in which the conductive metal particles and the third non-sintering ceramic material powder are in a fixed state. Thus, in the firing step in which the external conductive film is formed from the conductive green film, the shrinkage in the primary surface direction is not likely to occur in the external conductive film. In addition, in the external conductive film, since sintering behavior is obtained by the glass component included in the first ceramic green layers as described above, a point to which a tensile stress is applied, which is a point at which a fracture in the laminate surface starts to occur and which is formed by independent shrinkage of the external conductive film, is unlikely to be generated. In addition, since the glass component diffuses into the external conductive film from the first ceramic layers located at the laminate side, the anchor structure described above can be easily provided.

The diffusion of the glass component into the external conductive film, which is effective to provide the above anchor structure, can be further promoted when the conductive green film includes no glass component before the firing step.

As the conductive metal particles included in the conductive green film, when conductive metal particles in the state in which the third non-sintering ceramic material powder is adhered to the surfaces thereof are used, a shrinkage suppressing effect by the third non-sintering ceramic material powder can be improved to a maximum extent. Thus, the addition amount of the third non-sintering ceramic material powder can be decreased, and as a result, a decrease in conductivity of the external conductive film after the firing can be minimized.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
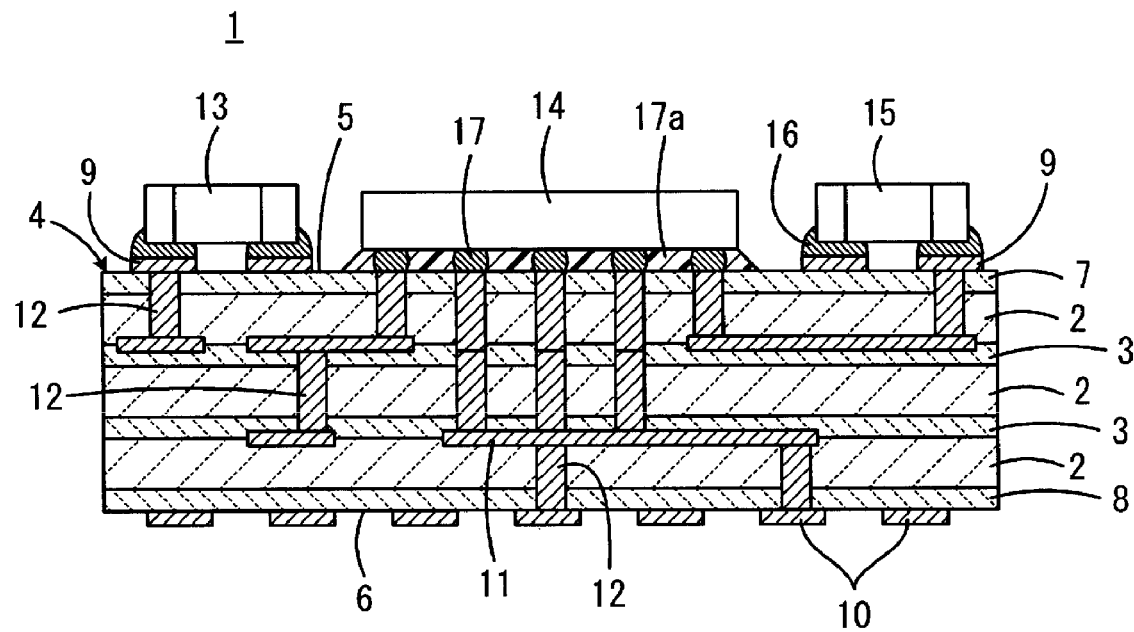
FIG. 1 is a cross-sectional view schematically showing a multilayer ceramic substrate 1 according to a preferred embodiment of the present invention.

FIG. 1 is a cross-sectional view schematically showing a multilayer ceramic substrate 1 according to a preferred embodiment of the present invention.

The multilayer ceramic substrate 1 includes a laminate 4 including a plurality of first ceramic layers 2 and second ceramic layers 3 located between the first ceramic layers 2. The laminate 4 further includes underlayers 7 and 8 disposed along an upper primary surface 5 and a lower primary surface 6, respectively, each facing the outside of the laminate 4. The underlayers 7 and 8 are disposed over substantially the entire primary surfaces 5 and 6 of the laminate 4, respectively.

Various wire conductors are provided for the multilayer ceramic substrate 1. As the wire conductors, there are preferably external conductive films 9 and 10 provided on the underlayers 7 and 8, respectively, internal conductive films 11 provided inside the laminate 4, and via hole conductors 12 arranged to penetrate at least the first ceramic layers 2 in the thickness direction. The via hole conductors 12 are connected to the internal conductive films 11, and among the conductors 12, at least one via hole conductor 12 is connected to the external conductive film 9 or 10 and is arranged to penetrate at least the underlayer 7 or 8 and a specific first ceramic layer 2 in the thickness direction.

The multilayer ceramic substrate 1 is further provided with surface mounting components 13 to 15 mounted on the upper primary surface 5 of the laminate 4. The surface mounting components 13 and 15 are preferably passive elements, such as a chip capacitor, a chip resistor, a chip thermistor, and a chip inductor, for example, and are electrically connected to the external conductive films 9 provided on the upper primary surface 5 with solders 16 interposed therebetween. The surface mounting component 15 is preferably an active element, such as a transistor, an IC chip, or an LSI chip, for example, and is electrically connected to end surfaces of the via hole conductors 12 exposed at the upper primary surface 5 of the laminate 4 with bumps 17 interposed therebetween. A gap between the surface mounting component 14 and the laminate 4 is filled with an underfill resin 17a.

When this multilayer ceramic substrate 1 is mounted on a printed circuit board (not shown) used as a mother board, the external conductive films 10 provided on the lower primary surface 6 of the laminate 4 are used to electrically connect and mechanically fix the multilayer ceramic substrate 1 to the printed circuit board.

The first ceramic layers 2 include a sintering ceramic material that preferably includes a glass component or that is capable of generating a glass component and are in a sintered state, and the properties of the laminate 4 are determined by the first ceramic layers 2. The thickness of the first ceramic layer 2 is preferably in the range of about 8 μm to about 100 μm, for example. Although not particularly limited to the above range, the thickness of the first ceramic layer 2 is preferably set to a certain value or less at which the shrinkage in the primary surface direction can be sufficiently minimized and prevented by the second ceramic layers 3 during a firing step which will be described below. In addition, the thicknesses of the first ceramic layers 2 may not be always equal or substantially equal to each other.

As the sintering ceramic material described above, a ceramic material that enables a glass component which is a portion thereof or a glass component generated during firing to diffuse into the second ceramic layers 3 is preferably used. In addition, as the sintering ceramic material, a low temperature firing ceramic material that can be fired at a relatively low temperature, such as about 1,000° C. or less, is preferably used so as to be simultaneously fired with a low melting point metal, such as Ag or Cu, for example, used as a conductive component for the external conductive films 9 and 10, the internal conductive films 11, and the via hole conductors 12. More particularly, a material including a Ba—Al—Si-based oxide ceramic material, for example, that generates glass during firing and an additive, such as a boron-based oxide, for example, added thereto or a glass ceramic material containing alumina and a borosilicate-based glass mixed therewith, for example, may be used.

The second ceramic layers 3 include a first non-sintering ceramic material powder that is not substantially sintered at a temperature at which the sintering ceramic material is sintered, and when the glass component from the first ceramic layer 2 partially diffuses into the second ceramic layers 3, the first non-sintering ceramic powder is in a fixed state. As the first non-sintering ceramic material powder, a powder formed from $Al_2O_3$ or ZrO, for example, is preferably used, and besides the above powders, for example, powders formed from $TiO_2$, $SiO_2$, $Nb_2O_5$, $Ta_2O_5$, and the like may also be used.

Since the second ceramic layers 3 include the first non-sintering ceramic material powder in a non-sintered state, which has a sintering temperature higher than that of the sintering ceramic material, as described above, the second ceramic layers 3 act on the first ceramic layers 2 so as to suppress the shrinkage in the primary surface direction during a firing step. In addition, the first non-sintering ceramic material powder is fixed when the glass component from the first ceramic layers 2 partially diffuses into the second ceramic layers 3. Thus, the second ceramic layer 3 must have a thickness that is sufficient to perform the action described above, and although depending on the state of the second ceramic layer 3, a desired restricting force, and firing conditions, the thickness of the second ceramic layer 3 is preferably in the range of approximately about 1 μm to about 8 μm, for example, after the firing.

The underlayers 7 and 8 include a second non-sintering ceramic material powder that is not substantially sintered at a temperature at which the above-described sintering ceramic material is sintered, and when the glass component from the first ceramic layer 2 partially diffuses into the underlayers 7 and 8, the second non-sintering ceramic material powder is in a fixed state. As the second non-sintering ceramic material powder, the same type of powder as the first non-sintering ceramic material powder is preferably used. In this case, the same type has a meaning that includes the same components but is not always required to have the same composition ratio. In addition, as for the thicknesses and other characteristics of the underlayers 7 and 8, substantially the same as that in the case of the second ceramic layers 3 may be said.

The external conductive films 9 and 10, the internal conductive films 11, and the via hole conductors 12, each functioning as a wiring conductor, are obtained by firing a conductive paste simultaneously together with the laminate 4.

Among those wiring conductors, the external conductive films 9 and 10 include conductive metal particles and a third non-sintering ceramic material powder that is not substantially sintered at a temperature at which the firing sintering ceramic material is sintered, and when the glass component from the first ceramic layers 2 partially diffuses into the external conductive films 9 and 10, the conductive metal particles and the third non-sintering ceramic material powder are in a fixed state. As the third non-sintering ceramic material powder, the same type as that of the first and the second non-sintering ceramic material powders is preferably used.

Figure 2:
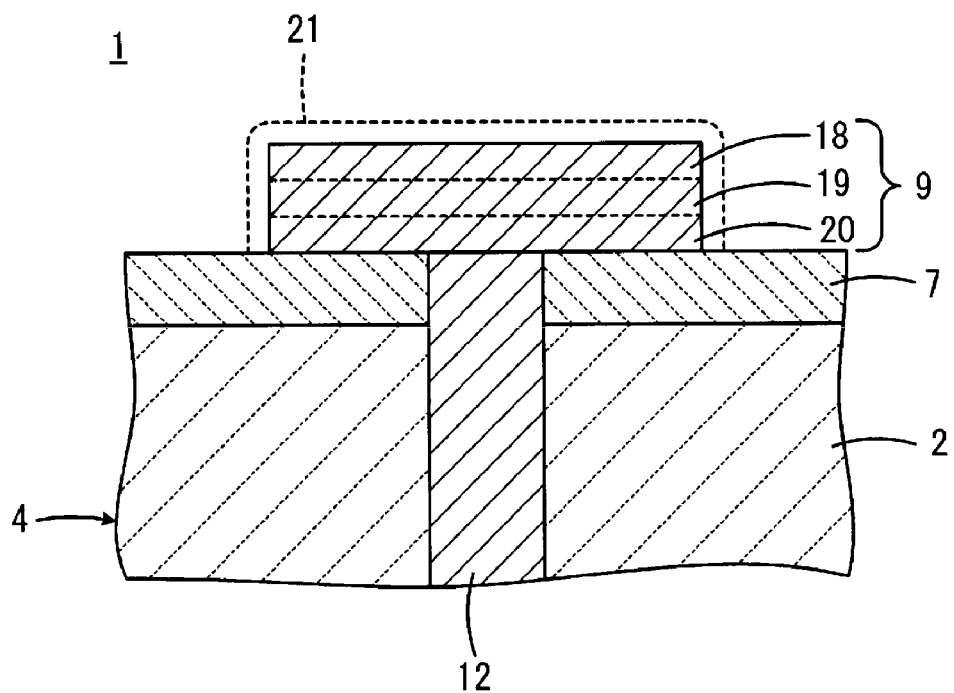
FIG. 2 is an enlarged cross-sectional view showing a portion at which an external conductive film 9 is provided, the portion being a portion of the multilayer ceramic substrate 1 shown in FIG. 1.

In FIG. 2, an enlarged cross-sectional view of the external conductive film 9 is shown. The external conductive film 9 is typically classified into a surface layer 18, an intermediate layer 19, and a bonding buffer layer 20 in that order from a surface side of the external conductive film 9 to an underlayer 7 side. In addition, the boundaries between the surface layer 18, the intermediate layer 19, and the bonding buffer layer 20 are not clearly recognized, unlike that shown in FIG. 2.

When the composition of the external conductive film 9 is observed based on an area ratio on a cross-sectional surface parallel or substantially parallel to the primary surface of the laminate 4, the area ratio of the conductive metal particles included in the external conductive film 9 preferably has a gradient increasing from the underlayer 7 side to the surface side of the external conductive film 9, and the area ratio of the third non-sintering ceramic material powder included in the external conductive film 9 preferably has a gradient increasing from the surface side of the external conductive film 9 to the underlayer 7 side. Accordingly, the surface layer 18 preferably includes the conductive metal particles as a primary component, the intermediate layer 19 preferably includes the conductive metal particles and the glass component as a primary component, and the bonding buffer layer 20 preferably includes the conductive metal particles, the glass component, and the non-sintering ceramic material powder as a primary component.

In particular, the bonding buffer layer 20 minimizes and prevents the shrinkage of the external conductive film 9 in the primary direction during a firing step and functions to prevent a tensile stress generated in a peripheral portion of the external conductive film 9 to the laminate 4 from being directly applied thereto, and as a result, the problems of generation of cracks and a decrease in strength are reduced. In addition, since the glass component from the first ceramic layer 2 deeply diffuses into the external conductive film 9 so as to define a portion of the primary components of the bonding buffer layer 20 and the intermediate layer 19 of the external conductive film 9, an anchor structure having superior bonding properties is provided, and as a result, a bonding strength of the external conductive film 9 can be increased.

As the conductive metal particles included in the external conductive film 9, for example, particles including at least one of Cu, Ag, Ni, and Pd are preferably used.

In addition, as shown by a dotted line in FIG. 2, a metal plating film 21 may also preferably be arranged so as to cover the external conductive film 9. The metal plating film 21 is preferably formed, for example, of a Ni electroless plating film and an Au electroless plating film formed thereon.

Although the external conductive film 9 is only described with reference to FIG. 2, substantially the same explanation as that for the external conductive film 9 may also be applied to the external conductive film 10.

Besides conductive metal particles similar to those included in the external conductive films 9 and 10, the via hole conductors 12 also preferably include a fourth non-sintering ceramic material powder that is not substantially sintered at a temperature at which the above sintering ceramic material is sintered. As described above, since the via hole conductor 12 includes the non-sintering ceramic material powder, the shrinkage of the via hole conductors 12 during a firing step can be prevented and minimized, the generation of stress in the external conductive films 9 and 10 connected to the via hole conductors can be suppressed thereby, and the reliability of bonding between the via hole conductors 12 and the external conductive films 9 and 10 can be improved. As the fourth non-sintering ceramic material powder, the same type of powder as that of the first, second, and third non-sintering ceramic material powders may be preferably used, for example.

The via hole conductor 12 preferably further includes a glass component. This glass component is preferably substantially the same type as that of the glass component to diffuse from the first ceramic layer 2 to the surrounding individual portions. When the via hole conductor 12 includes a glass component, a bonding buffer layer similar to the bonding buffer layer 20 may also preferably be provided at the interface of the via hole conductor 12 and the external conductive film 9, and the bonding strengths of the via hole conductor 12 to the surrounding first and the second ceramic layers 2 and 3 can be improved.

Figure 3:
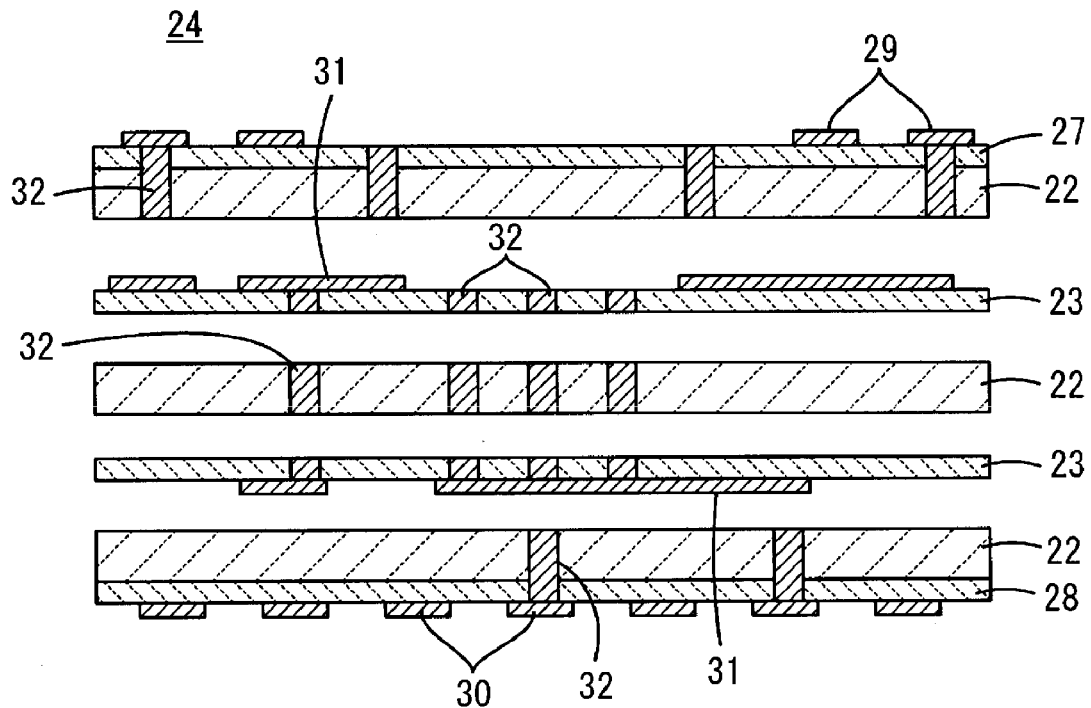
FIG. 3 is an exploded cross-sectional view showing a green laminate 24 for manufacturing the multilayer ceramic substrate 1 shown in FIG. 1.

Next, an example of a method for manufacturing the multilayer ceramic substrate 1 according to a preferred embodiment of the present invention will be described. In FIG. 3, an exploded green laminate 24 to be formed into the laminate 4 of the multilayer ceramic substrate 1 is shown.

The green laminate 24 includes first ceramic green layers 22 each including the sintering ceramic material to be formed into the first ceramic layers 2, second ceramic green layers 23 each including the first non-sintering ceramic material powder to be formed into the second ceramic layers 3, and underlying green layers 27 and 28 each including the second non-sintering ceramic material powder to be formed into the underlayers 7 and 8. In addition, on the green laminate 24, conductive green films 29 and 30 each including the conductive metal particles and the third non-sintering ceramic material powder to be formed into the external conductive films 9 and 10 are formed.

Figure 4:
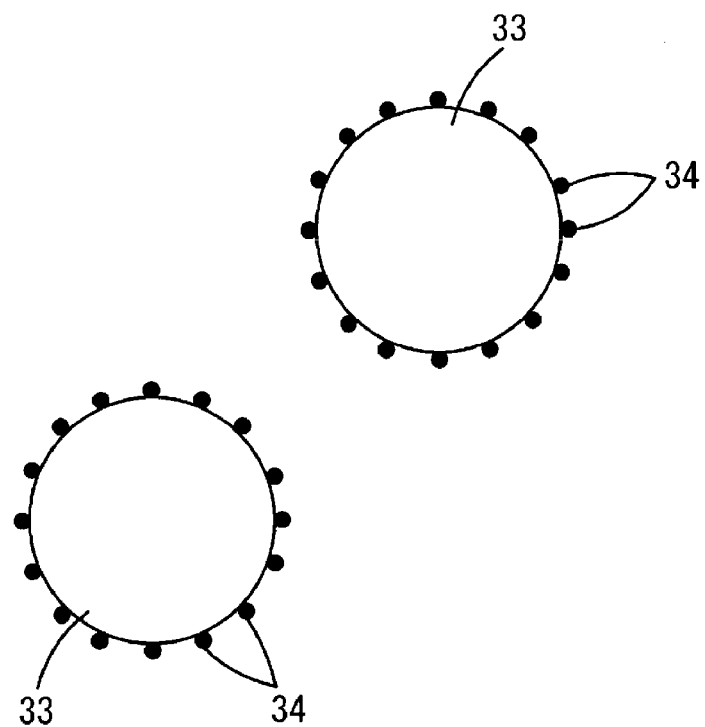
FIG. 4 is an enlarged view schematically showing the state of conductive metal particles 33 and a third non-sintered ceramic material powder 34 included in conductive green films 29 and 30 shown in FIG. 3.

At least some of conductive metal particles 33 included in the conductive green films 29 and 30 are preferably in a state in which particles of a third non-sintering ceramic material powder 34 are adhered to the surfaces of the particles 33, as shown in FIG. 4. As one example, the conductive metal particles 33 are preferably used when about 20 percent by weight of all of the particles of the third non-sintering ceramic material powder 34 is approximately uniformly adhered in advance to the surfaces thereof, the powder 34 being included in a conductive paste that forms the conductive green films 29 and 30. In order to uniformly adhere the third non-sintering ceramic material powder 34 to the surfaces of the conductive metal particles 33, the third non-sintering ceramic material powder 34 preferably has a small diameter, and for example, an average particle diameter of approximately 30 nm, for example, is most preferable. However, even when a powder having an average particle diameter of approximately 1 μm, for example, is used, the effect of the third non-sintering ceramic material powder 34 may not be degraded. In addition, among all particles of the third non-sintering ceramic material powder 34 included in the above conductive paste, the average particle diameter of particles adhered to the surfaces of the conductive metal particles 33 may preferably be different from that of the other particles which are not adhered thereto. As described above, when the third non-sintering ceramic material powder 34 adhered to the surfaces of the conductive metal particles 33 is contained in the conductive green films 29 and 30, the shrinkage suppressing effect due to the third non-sintering ceramic material powder 34 can be maximally improved, and even when the amount of the third non-sintering ceramic material powder 34 is small, a sufficient effect can be obtained, so that the conductivity of the external conductive films 9 and 10 thus formed is not degraded.

In addition, conductive green films 31 to be formed into the internal conductive films 11 are formed in the green laminate 24. The conductive green films 31 may have the same or substantially the same composition as that of the conductive green films 29 and 30 described above or may include no non-sintering ceramic material powder.

Furthermore, conductive green conductors 32 to be formed into the via hole conductors 12 are formed in the green laminate 24. The conductive green conductors 32 include conductive metal particles and the fourth non-sintering ceramic material powder, as described above, and preferably further include a glass component, for example.

In order to obtain the green laminate 24, the following steps are performed. That is, after ceramic green sheets forming the first and the second ceramic green layers 22 and 23 and the underlying green layers 27 and 28 are prepared, or after composite ceramic green sheets are prepared, for example, by forming the second green layers 23 on ceramic green sheets forming the first ceramic green layers 22 and forming the underlying green layers 27 and 28, the conductive green films 29 to 31 and the conductive green conductors 32 are formed on or in specific ceramic green sheets, and these ceramic green sheets are then laminated to each other in accordance with a predetermined order and direction, followed by pressure bonding.

Next, the green laminate 24 is fired at a temperature at which the sintering ceramic material is sintered, the first, second, third, and fourth non-sintering ceramic material powders are not substantially sintered, and the conductive metal powders are not melted, so that the laminate 4 is obtained. An atmosphere used in this firing step is preferably appropriately adjusted in accordance with the type of sintering ceramic material and the type of conductive metal powder.

By the firing step described above, the first ceramic green layers 22 are sintered, so that the first ceramic layers 2 in a sintered state are obtained. In addition, portions of the glass component from the first ceramic green layers 22 preferably diffuse into the second ceramic green layers 23, the underlying green layers 27 and 28, and the conductive green films 29 and 30. Of course, in some cases, portions of the glass component also diffuse into the conductive green films 31 and the conductive green conductors 32.

The glass component that diffuses into the second ceramic green layers 23 and the underlying green layers 27 and 28 fixes the first and the second non-sintering ceramic material powders, and as a result, the second ceramic layers 3 and the underlayers 7 and 8 in the state in which the first and the second non-sintering ceramic material powders are respectively fixed are obtained.

Since the glass component that diffuses into the underlying green layers 27 and 28 described above has a low viscosity and a high fluidity, it further diffuses into the conductive green films 29 and 30. This glass component is allowed to move so as to incorporate the third non-sintering ceramic material powder included in the conductive green films 29 and 30, and as a result, the external conductive films 9 and 10 in the state in which the conductive metal particles and the third non-sintering ceramic material powder are fixed together are obtained. In addition, as a result of the movement of the glass component described above, the third non-sintering ceramic material powder included in the conductive green films 29 and that included in the conductive green films 30 move to underlying green layers 27 and 28 sides, respectively.

As a result, in the external conductive films 9 and 10 thus obtained, as shown in FIG. 2, the concentration gradient of the conductive metal particles and that of the third non-sintering ceramic material powder are preferably obtained so as to form the surface layer 18, the intermediate layer 19, and the bonding buffer layer 20. In order to smoothly obtain the behavior of the glass component in the conductive green films 29 and 30 as described above, the conductive green films 29 and 30 preferably include no glass component before the firing step, that is, the conductive paste used to form the conductive green films 29 and 30 preferably includes no glass component.

Next, whenever necessary, a step of forming the metal plating films 21 is performed on the external conductive films 9 and 10 formed on the external surfaces of the fired laminate 4, and subsequently, the surface mounting components 13 to 15 are mounted on the upper primary surface 5 of the laminate 4, so that the multilayer ceramic substrate 1 is completed.

Next, an experimental example performed to confirm the effects and advantages of various preferred embodiments of the present invention will be described.

For this experimental example, by using conductive pastes for external conductive films and conductive pastes for via hole conductors, according to Examples 1 to 3 and Comparative Examples 1 to 3, which will be described later in detail, multilayer ceramic substrates used as samples were formed.

As the sintering ceramic material included in the first ceramic layer, which was commonly used for the multilayer ceramic substrates of the individual samples, a compound including a Ba—Al—Si-based oxide ceramic material and a boron-based oxide as an additive was used, as the first non-sintering ceramic material powder contained in the second ceramic layer, an alumina powder was used, as the conductive metal particles, Cu particles were used, the thickness of the first ceramic layer after the firing was set to about 20 µm, and the thicknesses of the second ceramic layer and the underlayer after firing were each set to about 3 µm. In addition, the multilayer ceramic substrates of the individual samples were evaluated as follows.

The multilayer ceramic substrate of each sample was reflow mounted on a printed circuit board having a thickness of about 1.0 mm using a solder paste, and the printed circuit board was fixed to a resin housing having an approximately rectangular parallelepiped shape so that the mounted multilayer ceramic substrate was located at a lower surface side. The weight of the housing was adjusted so that the total weight including the multilayer ceramic substrate, the printed circuit board, and the housing was about 100 g.

Next, after the housing was arranged so that a lower surface side thereof was parallel or substantially parallel to the ground at a predetermined height above a concrete block that was arranged so that an upper surface thereof was parallel or substantially parallel to the ground, the housing was allowed to fall about 100 times from the predetermined height so that a lower surface portion of the housing and an upper surface portion of the concrete block collided parallel or substantially parallel to each other to generate a fracture in the multilayer ceramic substrate of each sample, and a fracture state thereof was then evaluated.

The falling height was increased from about 0.5 m at regular intervals of about 0.1 m, and a falling height at which the fracture occurred was regarded as "fracture generation height". In addition, fracture modes were classified in accordance with the standards shown in FIG. 5.

Figure 5:
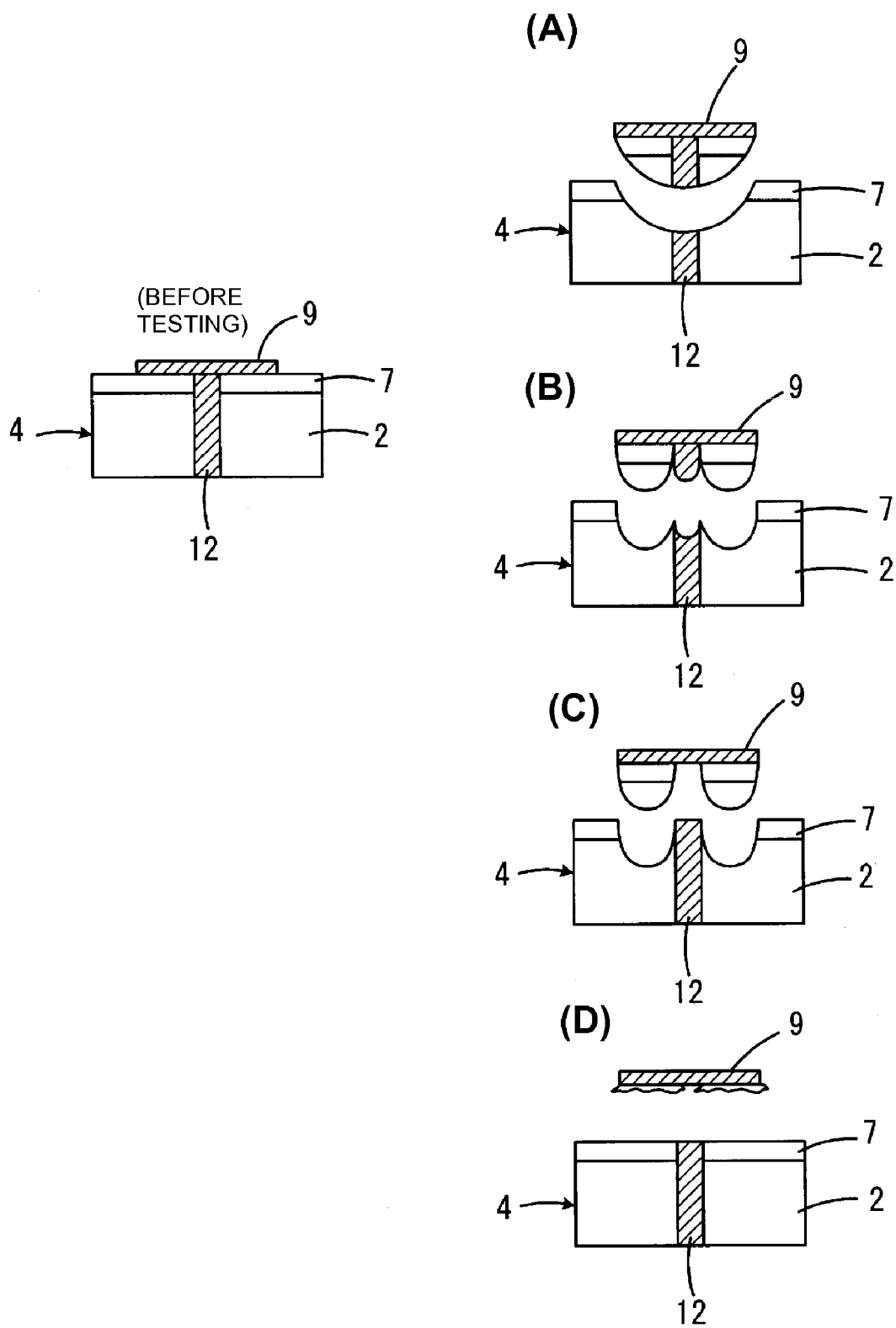
FIG. 5 includes views illustrating the standards of fracture modes evaluated in an experimental example performed to confirm effects and advantages of preferred embodiments of the present invention.

In FIG. 5, elements corresponding to those shown in FIG. 1 are designated by similar reference numerals. With reference to FIG. 5, as shown by a comparison with the state "before testing", according to a fracture mode A, the external conductive film 9 was fractured so that the laminate 4 had a large bore therein. According to a fracture mode B, the external conductive film 9 was fractured together with a portion of the via hole conductor 12 and a portion of the laminate 4. According to a fracture mode C, although the external conductive film 9 was fractured together with a portion of the laminate 4, the via hole conductor 12 was not damaged. According to a fracture mode D, the external conductive film 9 was fractured so as to be peeled away from the laminate 4 and the via hole conductor 12. In addition, in fracture mode D, a portion of the underlayer 7 having a very small thickness was adhered to the external conductive film 9 thus peeled away in some cases.

When the bonding strength of the external conductive film 9 to the laminate 4 and the via hole conductor 12 was examined, the fracture mode A could be most highly evaluated, and the evaluation of the fracture modes B, C, and D decreased in that order.

EXAMPLE 1

In Example 1, as the conductive paste for external conductive films, a paste including Cu particles and a non-sintering ceramic material powder shown in Table 1 was used, and as the conductive paste for via hole conductors, a paste was used including Cu particles and resin beads that were used as a shrinkage adjusting agent and that were not dissolved in a paste solvent.

COMPARATIVE EXAMPLE 1

In Comparative Example 1, as the conductive paste for external conductive films, a paste including Cu particles and no non-sintering ceramic material powder was used, and as the conductive paste for via hole conductors, a paste similar to that used in the above Example 1 was used.

EXAMPLE 2

In Example 2, as the conductive paste for external conductive films, a paste including Cu particles and a non-sintering ceramic material powder shown in Table 1 was used, and as the conductive paste for via hole conductors, a paste was used including Cu particles, resin beads similar to those used in Example 1, and a non-sintering ceramic material powder shown in Table 1.

COMPARATIVE EXAMPLE 2

In Comparative Example 2, as the conductive paste for external conductive films, a paste including Cu particles and no non-sintering ceramic material powder was used, and as the conductive paste for via hole conductors, a paste similar to that used in Example 2 was used.

EXAMPLE 3

In Example 3, as the conductive paste for external conductive films, a paste including Cu particles and a non-sintering ceramic material powder shown in Table 1 was used, and as the conductive paste for via hole conductors, a paste was used including Cu particles, resin beads similar to those used in Example 1, a non-sintering ceramic material powder shown in Table 1, and a Si—B—Ba-based glass.

COMPARATIVE EXAMPLE 3

In Comparative Example 3, as the conductive paste for external conductive films, a paste including Cu particles and no non-sintering ceramic material powder was used, and as the conductive paste for via hole conductors, a paste was used including Cu particles, resin beads similar to those used in Example 1, a non-sintering ceramic material powder shown in Table 1, and a Si—B—Ba-based glass.

The "fracture generation height" and the "fracture mode" of the multilayer ceramic substrates formed using the conductive pastes of Examples 1 to 3 and Comparative Examples 1 to 3 were evaluated, and the results are shown in Table 1.

In Examples 1 to 3, the same material was used as the second and the third non-sintering ceramic material powders. However, even when alumina was used as the second non-sintering ceramic material and ZrO was used as the third non-sintering ceramic material, the fracture mode A was obtained at a falling height of about 2.0 m.

TABLE 1

|  | Sample No. | Non-sintering ceramic material powder | Fracture generation height | Fracture mode |
|---|---|---|---|---|
| Example 1 | 1 | $Al_2O_3$ | 1.5 m | C |
|  | 2 | ZrO | 1.5 m | C |
|  | 3 | $TiO_2$ | 1.3 m | C |
|  | 4 | $SiO_2$ | 1.3 m | C |
|  | 5 | $Nb_2O_5$ | 1.2 m | C |
|  | 6 | $Ta_2O_5$ | 1.2 m | C |
| Comparative Example 1 | 7 | $Al_2O_3$ | 0.8 m | D |
|  | 8 | ZrO | 0.8 m | D |
|  | 9 | $TiO_2$ | 0.7 m | D |
|  | 10 | $SiO_2$ | 0.7 m | D |
|  | 11 | $Nb_2O_5$ | 0.7 m | D |
|  | 12 | $Ta_2O_5$ | 0.7 m | D |
| Example 2 | 13 | $Al_2O_3$ | 1.7 m | B |
|  | 14 | ZrO | 1.7 m | B |
| Comparative Example 2 | 15 | $Al_2O_3$ | 0.8 m | D |
|  | 16 | ZrO | 0.8 m | D |
| Example 3 | 17 | $Al_2O_3$ | 2.0 m | A |
|  | 18 | ZrO | 2.0 m | A |
| Comparative Example 3 | 19 | $TiO_2$ | 0.8 m | D |
|  | 20 | $SiO_2$ | 0.8 m | D |

As shown in Table 1, the bonding strengths of Examples 1 to 3 were improved as compared to those of Comparative Examples 1 to 3. That is, according to Examples 1 to 3, a fracture generation height of at least about 1.0 m was obtained, and the fracture modes were evaluated as A to C. On the other hand, according to Comparative Examples 1 to 3, the fracture generation height was less than about 1.0 m, and the fracture mode was also evaluated as D. The reason for this is that, although the conductive paste for external conductive films according to Examples 1 to 3 included the non-sintering ceramic material powder, it was not included in Comparative Examples 1 to 3.

When Examples 1 to 3 were compared with each other, in terms of the fracture generation height and the fracture mode, Example 3 was most preferable, Example 2 was second thereto, and Example 1 was inferior to Example 2. The reasons for this are that the conductive paste for via hole conductors in Example 3 included both the non-sintering ceramic material powder and the glass, the glass was not included in Example 2, and in Example 1, the non-sintering ceramic material powder was also not included.

In addition, when Samples 1 to 6 of Example 1 were compared to each other, since a larger fracture generation height was obtained in Samples 1 and 2 than that of the other Samples 3 to 6, it was found that as the non-sintering ceramic material powder, a powder including $Al_2O_3$ or ZrO was preferably used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
a laminate including:
a plurality of first ceramic layers each including a sintering ceramic material that includes a glass component or that is capable of generating a glass component and each being in a sintered state; and
at least one second ceramic layer arranged between the first ceramic layers and that includes a first non-sintering ceramic material powder that is not substantially sintered at a temperature at which the sintering ceramic material is sintered, in which the first non-sintering ceramic material powder is in a fixed state due to a portion of the glass component being diffused from the first ceramic layers into the second ceramic layer; wherein
the laminate further includes at least one underlayer that is disposed along at least one primary surface thereof facing outside of the laminate and that includes a second non-sintering ceramic material powder that is not substantially sintered at a temperature at which the sintering ceramic material is sintered, in which the second non-sintering ceramic material powder is in a fixed state due to a portion of the glass component being diffused from the first ceramic layers into the underlayer;
at least one external conductive film is provided on the underlayer that includes conductive metal particles and a third non-sintering ceramic material powder that is not substantially sintered at a temperature at which the sintering ceramic material is sintered, in which the conductive metal particles and the third sintering ceramic material are in a fixed state due to a portion of the glass component being diffused from the first ceramic layers into the external conductive film; and
when an area ratio on a cross-sectional surface parallel or substantially parallel to the primary surface of the laminate is observed, an area ratio of the conductive metal particles included in the external conductive film has a gradient that increases from the underlayer side to a surface side of the external conductive film, and an area ratio of the third non-sintering ceramic material powder included in the external conductive film has a gradient that increases from the surface side of the external conductive film to the underlayer side.

2. The multilayer ceramic substrate according to claim 1, wherein the first, second, and third non-sintering ceramic material powders are made the same type of ceramic material.

3. The multilayer ceramic substrate according to claim 1, wherein the underlayer is disposed over substantially the entire primary surface of the laminate.

4. The multilayer ceramic substrate according to claim 1, further comprising:
  at least one via hole conductor connected to the external conductive film and arranged to penetrate at least the underlayer and a specific first ceramic layer in the thickness direction; wherein
  the via hole conductor includes the conductive metal particles and a fourth non-sintering ceramic material powder that is not substantially sintered at a temperature at which the sintering ceramic material is sintered.

5. The multilayer ceramic substrate according to claim 1, wherein the conductive metal particles include at least one of Cu, Ag, Ni, and Pd.

6. The multilayer ceramic substrate according to claim 1, wherein the non-sintering ceramic material powders include an oxide including at least one of Al, Zr, Ti, Si, Nb, and Ta.

7. The multilayer ceramic substrate according to claim 1, wherein the sintering ceramic material is a Ba—Al—Si-based oxide ceramic material.

8. The multilayer ceramic substrate according to claim 1, further comprising a metal plating film arranged to cover the external conductive film.

9. The multilayer ceramic substrate according to claim 4, wherein the first, second, third, and fourth non-sintering material powders are made of the same type of ceramic material.

10. The multilayer ceramic substrate according to claim 4, wherein the via hole conductor further includes a glass component.

11. A method for manufacturing the multilayer ceramic substrate according to claim 1, comprising the steps of:
  preparing a green laminate to be formed into the laminate, the green laminate being formed of first ceramic green layers including the sintering ceramic material to be formed into the first ceramic layers, at least one second ceramic green layer including the first non-sintering ceramic material powder to be formed into the second ceramic layer, and at least one underlying green layer including the second non-sintering ceramic material powder to be formed in the underlayer, and the green laminate being provided with at least one conductive green film including the conductive metal particles and the third non-sintering ceramic material powder to be formed into the external conductive film; and
  firing the green laminate provided with the conductive green film at a temperature at which the sintering ceramic material is sintered, the first, second, and third non-sintering ceramic material powders are not substantially sintered, and the conductive metal particles are not melted to obtain the first ceramic layers in a sintered state and to allow a portion of the glass component from the first ceramic layers to diffuse into the second ceramic green layer, the underlying green layer, and the conductive green film, so that the second ceramic layer and the underlayer are obtained in which the first and the second non-sintering ceramic material powders are in a fixed state, respectively, and so that the external conductive film is obtained in which the conductive metal particles and the third non-sintering ceramic material powder are in a fixed state.

12. The method for manufacturing the multilayer ceramic substrate according to claim 11, wherein at least some of the conductive metal particles included in the conductive green film are in the state in which the third non-sintering ceramic material powder is adhered to the surfaces thereof.

13. The method for manufacturing a multilayer ceramic substrate according to claim 11, wherein before the step of firing the green laminate, the conductive green film includes no glass component.

\* \* \* \* \*